(12) United States Patent
Simon

(10) Patent No.: US 7,738,582 B2
(45) Date of Patent: *Jun. 15, 2010

(54) APPARATUS, SYSTEMS AND METHODS FOR PRODUCING COHERENT SYMBOLS IN A SINGLE FREQUENCY NETWORK

(75) Inventor: Michael Simon, Frederick, MD (US)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1144 days.

This patent is subject to a terminal disclaimer.

(21) Appl. No.: 11/276,434

(22) Filed: Feb. 28, 2006

(65) Prior Publication Data

US 2006/0200852 A1 Sep. 7, 2006

Related U.S. Application Data

(60) Provisional application No. 60/740,424, filed on Nov. 29, 2005, provisional application No. 60/657,416, filed on Mar. 2, 2005.

(51) Int. Cl.
*H04L 5/12* (2006.01)
(52) U.S. Cl. ..................................... 375/265
(58) Field of Classification Search ......... 375/259–261, 375/265, 354, 256; 370/464, 498, 503, 505; 714/699, 746, 786, 792, 752, 775, 776, 789; 455/3.01, 3.02
See application file for complete search history.

(56) References Cited

U.S. PATENT DOCUMENTS

| 5,216,503 | A | 6/1993 | Paik et al. |
| 5,614,914 | A | 3/1997 | Bolgiano et al. ............ 342/364 |
| 5,903,574 | A | 5/1999 | Lyons |
| 6,005,605 | A | 12/1999 | Kostreski et al. |
| 6,088,337 | A | 7/2000 | Eastmond et al. ........... 370/280 |
| 6,130,898 | A | 10/2000 | Kostreski et al. ........... 370/522 |
| 6,269,092 | B1 | 7/2001 | Schilling |

(Continued)

FOREIGN PATENT DOCUMENTS

DE 196 17 293 11/1997

(Continued)

OTHER PUBLICATIONS

"ATSC Standard: Synchronization Standard for Distributed Transmission (A/110)", Advanced Television Systems Committee (Jul. 14, 2004).

(Continued)

*Primary Examiner*—David C Payne
*Assistant Examiner*—Vineeta S Panwalkar
(74) *Attorney, Agent, or Firm*—Fitzpatrick, Cella, Harper & Scinto

(57) ABSTRACT

A system, method, apparatus and computer code are provided for producing coherent symbols from digital RF transmitters. A multiplexer receives a digital signal containing content data to be broadcast from the digital RF transmitters and inserts a first initialization packet into the digital signal, where the initialization packets implicit position in the digital signal will signal data framing in the digital RF transmitters. Where the initialization packet contains stuff bytes for deterministically initializing Trellis coders in the digital RF transmitters. A transport stream emitter transmits the digital signal to the plurality of digital RF transmitters.

80 Claims, 9 Drawing Sheets

U.S. PATENT DOCUMENTS

| | | | |
|---|---|---|---|
| 6,313,885 B1 | 11/2001 | Patel et al. | 348/725 |
| 6,324,186 B1 | 11/2001 | Mahn | 370/503 |
| 6,414,720 B1 | 7/2002 | Tsukidate et al. | 348/469 |
| 6,477,180 B1 | 11/2002 | Aggarwal et al. | 370/468 |
| 6,480,236 B1 | 11/2002 | Limberg | 348/555 |
| 6,496,477 B1 | 12/2002 | Perkins et al. | 370/228 |
| 6,631,491 B1 * | 10/2003 | Shibutani et al. | 714/762 |
| 6,640,239 B1 | 10/2003 | Gidwani | 709/203 |
| 6,721,337 B1 | 4/2004 | Kroeger et al. | 370/477 |
| 6,772,434 B1 | 8/2004 | Godwin | |
| 6,801,499 B1 | 10/2004 | Anandakumar et al. | 370/229 |
| 6,930,983 B2 | 8/2005 | Perkins et al. | 370/252 |
| 7,110,048 B2 | 9/2006 | Weiss | 348/723 |
| 7,111,221 B2 | 9/2006 | Birru et al. | 714/755 |
| 7,336,646 B2 | 2/2008 | Muller | |
| 7,349,675 B2 | 3/2008 | Karr et al. | 455/102 |
| 7,382,838 B2 | 6/2008 | Peting | 375/327 |
| 2001/0033341 A1 | 10/2001 | Limberg | |
| 2002/0001349 A1 | 1/2002 | Bretl et al. | |
| 2002/0085548 A1 | 7/2002 | Ku et al. | 370/386 |
| 2002/0097336 A1 | 7/2002 | Oshima | 348/487 |
| 2002/0140867 A1 | 10/2002 | Weiss | |
| 2003/0099303 A1 | 5/2003 | Birru et al. | |
| 2003/0201932 A1 | 10/2003 | Rabinowitz et al. | |
| 2004/0013133 A1 | 1/2004 | Fimoff et al. | 370/473 |
| 2004/0062283 A1 | 4/2004 | Takeuchi et al. | |
| 2004/0066736 A1 | 4/2004 | Kroeger | 370/200 |
| 2004/0148642 A1 * | 7/2004 | Park et al. | 725/148 |
| 2004/0160344 A1 | 8/2004 | Bretl et al. | |
| 2004/0190779 A1 | 9/2004 | Sarachik et al. | |
| 2004/0237024 A1 | 11/2004 | Limberg | 714/784 |
| 2004/0240460 A1 | 12/2004 | Hwang et al. | 370/412 |
| 2005/0013249 A1 | 1/2005 | Kong et al. | 370/235 |
| 2005/0074074 A1 | 4/2005 | Limberg | |
| 2005/0207416 A1 | 9/2005 | Rajkotia | 370/390 |
| 2005/0249300 A1 | 11/2005 | Jeong et al. | 375/265 |
| 2005/0249301 A1 | 11/2005 | Jeong et al. | 375/265 |
| 2005/0259643 A1 | 11/2005 | Chuah et al. | 370/389 |
| 2006/0050770 A1 | 3/2006 | Wallace et al. | 375/144 |
| 2006/0200853 A1 | 9/2006 | Simon | 725/118 |
| 2006/0244865 A1 | 11/2006 | Simon | 348/614 |
| 2006/0245516 A1 | 11/2006 | Simon | 375/295 |
| 2006/0246836 A1 | 11/2006 | Simon | 455/3.01 |
| 2007/0066272 A1 | 3/2007 | Vassiliou et al. | |
| 2007/0189410 A1 | 8/2007 | Zeng | 375/267 |
| 2007/0223612 A1 | 9/2007 | Simon | 375/265 |
| 2009/0252266 A1 | 10/2009 | Heinemann et al. | 375/362 |

FOREIGN PATENT DOCUMENTS

| | | |
|---|---|---|
| DE | 10 2006 015 393 | 4/1998 |
| EP | 0 837 609 | 4/1998 |
| EP | 1 753 249 | 2/2007 |
| WO | 2004062283 A1 | 7/2004 |
| WO | 2006/066617 | 6/2006 |

OTHER PUBLICATIONS

"ATSC Standard: Synchronization Standard for Distributed Transmission, Revision A (A/110A)", Advanced Television Systems Committee (Jul. 19, 2005).

Whitaker, J. C., "Standard Handbook of Video and Television Engineering", Chapter 17.2 "ATSC DTV Received Systems", pp. 17-63 to 17-99 (2000).

"Lecture 4: Digital Television The DVB transport stream", obtained from http://www.abo.fi/~jbjorkqv/digitv/lect4.pdf (last visited May 4, 2006).

Wang, X. et al., "Transmitter Identification in Distributed Transmission Network and Its Applications in Position Location and a New Data Transmission Scheme", NAB Broadcast Engineering Conference, Las Vegas, NV, p. 511-520 (Apr. 16-21, 2005).

Vogel, W. J., et al., "Propagation Effects and Satellite Radio Design", Paper No. 1445, Maastricht Exhibition and Congress Centre (MECC) Maastricht, the Netherlands (Aug. 17-24, 2002).

Patel, C. B., et al., "Proposal to ATSC Subcommittee T3/S9 to Provide 8-VSB with a Repetitive-PN1023 Signal For Rapidly and Reliably Initializing Tracking in an Adaptive Equalizer Despite Adverse Multipath Conditions" (Apr. 12, 2001).

Raghunandan, K., "Satellite Digital Audio Radio Service (SDARS) System Architecture and Receiver Review", IEEE (Oct. 27, 2005).

Owen, H., "Proposed Modifications to ATSC Digital Television Standard to Improve Performance in the Face of Dynamic Multipath for both Fixed and Mobile Operation", Sarnoff Corporation, Princeton, NJ (Apr. 2, 2001).

"ATSC Technology Group Report: DTV Signal Reception and Processing Considerations", Doc. T3-600r4, Advanced Television Systems Committee (Sep. 18, 2003).

Proposal for Enhancement of ATSC RF Transmission System (Revision to A/53), submitted by Samsung, Draft ver. 1.0 (Sep. 16, 2004).

Citta, R., et al., "ATSC Transmission System: VSB Tutorial", Zenith Electronics Corporation, Symposium Handout, Montreuz Symposium (Jun. 12, 1997).

"ATSC Recommended Practice: Design of Synchronized Multiple Transmitter Networks (A/111)", Advanced Television Systems Committee (Sep. 3, 2004).

Lee, Y., et al., "ATSC Terrestrial Digital Television Broadcasting Using Single Frequency Networks", ETRI Journal, vol. 26, No. 2, pp. 92-100, Apr. 2004.

"ATSC Digital Television Standard (A/53) Revision E", Advanced Television Systems Committee (Dec. 27, 2005).

International Search Report and Written Opinion of the International Searching Authority, PCT/US06/015317, May 14, 2008.

International Search Report and Written Opinion of the International Searching Authority, PCT/US06/07251, May 20, 2008.

Battisa, "Spectrally efficient high data rate waveforms for the UFO SATCOM channel", Military Communications Conference, 1998, MILCOM 98. Proceedings, IEEE vol. 1, Oct. 18-21, 1998, pp. 134-139 vol. 1.

Notice of Allowance in U.S. Appl. No. 11/276,453 (Jan. 28, 2009).

Office Action Summary in U.S. Appl. No. 11/276,453 (Nov. 17, 2008).

"Digital Video Broadcasting (DVB); DVB mega-frame for Single Frequency Network (SFN) synchronization", European Broadcasting Union, ETSI TS 101 191 v1.4.1 (Jun. 2004).

International Preliminary Report on Patentability, PCT/US2006/020599, Nov. 30, 2007.

Jintao Wang, et al., "A New Implementation of Single Frequency Network Based on DMB-T", 2004 International Conference on Communications, Circuits and Systems, 2004, ICCCAS 2004, vol. 1, Jun. 27-29, 2004, vol. 1, pp. 246-249.

International Search Report and Written Opinion of the International Searching Authority, PCT/US06/20599, Aug. 31, 2007.

International Search Report and Written Opinion of the International Searching Authority, PCT/US06/07265, Sep. 4, 2007.

International Preliminary Report on Patentability and Written Opinion of the International Application, PCT/US2006/007265, Nov. 1, 2007.

International Preliminary Report on Patentability and Written Opinion of the International Searching Authority, PCT/US2006/022300 Dec. 27, 2007.

ATSC Standard: Synchronization Standard for Distributed Transmission, Revision B (A/110B) Advanced Television Systems Committee, Dec. 24, 2007.

* cited by examiner

FIG. 3
Prior Art

| Syntax | No. of Bits | Format |
|---|---|---|
| DTx_packet (){ | | |
|     reserved | 8 | 0xFF |
|     for (i=0; i<12; i++) { | | |
|         trellis_code_state | 8 | riuimsbfwp |
|     } | | |
|     synchronization_time_stamp | 24 | uimsbf |
|     maximum_delay | 24 | uimsbf |
|     network_identifier_pattern | 12 | uimsbf |
|     stream_locked_flag | 1 | bslbf |
|     reserved | 1 | '1' |
|     packet_number | 10 | uimsbf |
|     reserved | 32 | 0xFFFFFFFF |
|     tx_group_number | 8 | uimsbf |
|     for (i=0; i<16; i++) { | | |
|         tx_address | 12 | uimsbf |
|         tx_identifier_level | 3 | uimsbf |
|         tx_data_inhibit | 1 | bslbf |
|         tx_time_offset | 16 | tcimsbf |
|         tx_power | 12 | uipfmsbf |
|         reserved | 4 | '1111' |
|     } | | |
|     reserved | 320 | for (i=0; 1<40; i++) 0xFF |
|     DTxP_ECC | 160 | uimsbf |
| } | | |

M=4, B=52, N=208, R-S Block = 207, BXM=N

FIG. 10

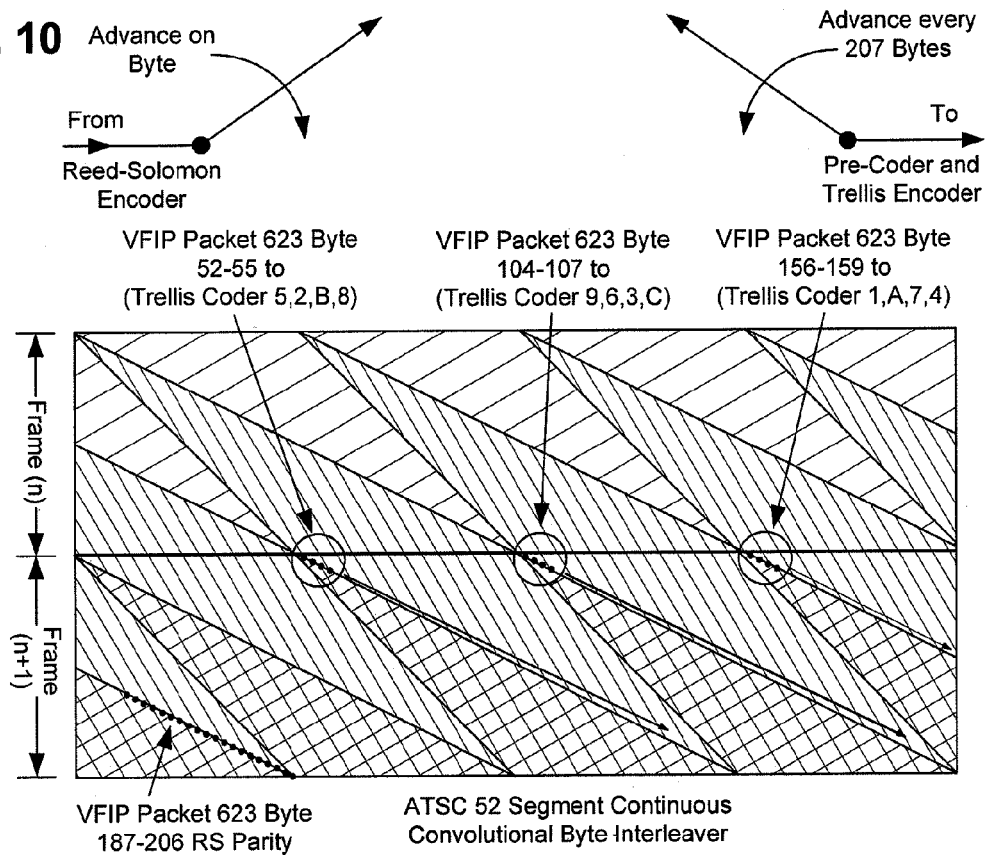

Advance on Byte
From Reed-Solomon Encoder

Advance every 207 Bytes
To Pre-Coder and Trellis Encoder

VFIP Packet 623 Byte 52-55 to (Trellis Coder 5,2,B,8)
VFIP Packet 623 Byte 104-107 to (Trellis Coder 9,6,3,C)
VFIP Packet 623 Byte 156-159 to (Trellis Coder 1,A,7,4)

Frame (n)
Frame (n+1)

VFIP Packet 623 Byte 187-206 RS Parity
ATSC 52 Segment Continuous Convolutional Byte Interleaver

FIG. 11

| Syntax | # bits | |
|---|---|---|
| VSB_Init_Packet(){ | | |
| Transport_packet_header | 32 | |
| periodic_flag | 1 | Period Of VFIP |
| periodic_value | 8 | |
| sync_time_stamp | 24 | Network Delay Compensation |
| maximum_delay | 24 | |
| network_ID | 12 | |
| For (i=0; i<20 i++) { | | |
| tx_address | 12 | |
| tx_ID_level | 3 | |
| tx_Data_Inhibit | 1 | |
| tx_time_offset | 16 | Individual Tx Delay |
| tx_power } | 12 | |
| Reserved stuff bytes DTR | 96 | |
| Reserved future use | xxx | |
| VFIP_FEC } | 160 | 20 Bytes RS Parity |

APPARATUS, SYSTEMS AND METHODS FOR PRODUCING COHERENT SYMBOLS IN A SINGLE FREQUENCY NETWORK

CROSS REFERENCE TO RELATED APPLICATIONS

This application claims priority to, and the benefit of, U.S. Provisional Patent Application Ser. No. 60/657,416, filed Mar. 2, 2005, and U.S. Provisional Application Ser. No. 60/740,424, filed Nov. 29, 2005, both of which are hereby incorporated herein by reference in their entirety.

BACKGROUND OF THE INVENTION

1. Field of the Invention

The present invention generally relates to single frequency networks (SFNs) using a multiplicity of transmitters, and more particularly to technology for producing coherent symbols to implement SFNs.

2. Related Art

A single-frequency network (SFN) is a collection of transmitters operating on the same frequency for carrying the same information to receivers in a given area. The transmitters emit identical signals, several of which may be received more or less simultaneously by individual receivers. One advantage of using multiple transmitters instead of one powerful transmitter is that multiple transmitters provide alternate paths for the signal to enter a structure, such as a house, thereby providing better reception. In mountainous areas, for example, it may be difficult to find one location capable of serving all the population centers in the area, since they are often located in valleys. Multiple transmitters can be strategically placed to cover such small areas and fill in the gaps.

One application of SFNs is for transmission of digitally encoded data such as digital television (DTV), the system and related standards for which have been established by the Advanced Television Systems Committee ("ATSC"). Under the ATSC's DTV standard (or A/53 standard), hereby incorporated herein by reference in its entirety, it is possible to transmit large amounts of data including high definition pictures, high quality sound, multiple standard definition pictures, and other ancillary related or unrelated communications, which may be accessible by using a computer or television set.

The DTV standard includes the following layers: the video/audio layer, compression layer, transport layer, and the transmission layer. At the top of the hierarchy is the uncompressed digital signal in one of the various digital data formats (e.g., video/audio formats). The data stream that corresponds with the video/audio layer is known as the elementary stream.

The compression layer compresses the elementary stream into a bitstream with a lower data rate. In the ATSC DTV standard, MPEG-2 compression is used for the video and the Dolby AC-3 compression is used for the audio. The compressed bitstream, in turn, may be packetized and multiplexed with other bitstreams into a higher data rate digital bitstream in the transport layer by an multiplexer. The MPEG-2 transport protocol defines (among several other things) how to packetize and multiplex packets into an MPEG-2 transport stream. The result is a stream of highly compressed data packets in a multiplexed bitstream which may include multiple programs and/or multiple data signals.

The multiplexed bitstream from the transport layer is modulated onto a radio frequency ("RF") carrier in the transmission layer by a transmission system. The terrestrial broadcast mode utilized in the current ATSC DTV standard to transmit digital signals over the airwaves is called eight-level Trellis Coded vestigial sideband (8T-VSB).

FIG. 1 is a block diagram of a well known Trellis-coded 8T-VSB transmitter 100 used in an RF transmission system. The transmitter receives the incoming data packets of interspersed video, audio, and ancillary data, and, using a data randomizer 102, randomizes the data to produce a flat, noise-like spectrum. A Reed-Solomon (RS) encoder 104, known for its good burst noise correction capability and data overhead efficiency, RS-encodes the randomized data to add parity bytes to the end of each data packet. In turn, the data is convolutionally interleaved (i.e., spread out) over many data segments by a byte data interleaver 106.

A pre-coder and Trellis encoder 108 (referred to in the specification hereafter as a "Trellis coder") adds additional redundancy to the signal in the form of multiple data levels, creating multilevel data symbols for transmission. A synchronization insertion component 110 multiplexes the segment and frame synchronizations with the multilevel data symbols before a DC offset is added by a pilot insertion component 112 for creation of the low-level, in-phase pilot. Segment and frame synchronizations are not interleaved. A VSB modulator 114 provides a filtered intermediate frequency (IF) signal at a standard frequency, with most of one sideband removed. Finally, an RF upconverter 116 translates the signal to the desired RF channel.

Multipath propagation is a common problem in single transmitter broadcast environments because it places a burden on a receiver equalizer's ability to handle signal echoes. In a distributed transmission system, where multiple transmitters are utilized, the multipath propagation problem is compounded. It is necessary, therefore, to synchronize or adjust the timing of the SFN system to control the delay spread seen by receivers in areas of SFN induced multipath not to exceed delay handling range of receiver equalizers and become problematic.

In addition, the output symbols of each transmitter is based on the transport stream received, how this is then mapped into a Data Frame and the initial states of the Trellis coders, which are normally random. When the transmitters emit the same symbols as one another for the same data inputs, they are said to be made "coherent". If the transmitters in an SFN are not synchronized, they will not emit coherent symbols.

The ATSC has promulgated a standard, referred to as the A/110 standard, which provides rules for synchronization of multiple transmitters emitting Trellis-coded 8T-VSB signals in an SFN or distributed transmission system (DTx) to create a condition which allows multiple transmitters being fed by the same transport stream to produce coherent symbols. SFN and DTx are to be understood to be synonymous terms. The A/110 standard is hereby incorporated herein by reference in its entirety.

FIG. 2 shows a block diagram of an ATSC SFN system 200 using A/110 distributed transmission (DTx). SFN system 200 includes three elements: an external time and frequency reference (shown as GPS), a distributed transmission adapter (DTxA) 202 situated at the source end of the distribution (or studio-to-transmitter link (STL)) subsystem, and plural RF transmission systems 208. DTxA includes two basic blocks: a transmitter synchronization inserter 206 and a data processing model 204. Transmitter synchronization inserter 206 inserts information (described in more detail below) into the transport stream (TS). The data processing model 204 is a model of the data processing in an ATSC modulator which serves as a master reference to the slaved synchronized data processing blocks 210 in the RF transmission systems 208.

Generally, each RF transmission system 208 includes two blocks: synchronized data processing block 210 and signal processing and power amplification block 211, which collectively are sometimes referred to as a "modulator" 212. These low level stages of the transmitter are also generally referred to as the "exciter" component. Herein the terms exciter and modulator are use interchangeably.

In an ATSC SFN system each synchronized data processing block 210 also includes a Trellis-coded 8-VSB transmitter 100 discussed above with reference to FIG. 1. As shown in FIG. 2, the DTxA produces a transport stream (TS) and feeds this stream to all of the synchronized data processing blocks 210.

FIG. 3 shows the structure of a distributed transmission packet in accordance with the A/110 standard and FIG. 4 depicts a VSB data frame, which includes packets of data and forward error correction (FEC), and data field synchronization (DFS) fields.

The A/110 standard requires the following three ATSC system elements to be synchronized: 1. frequency synchronization of the pilot or carrier frequencies, 2. data frame synchronization, and 3. pre-coder and Trellis encoder (Trellis coder) synchronization. A description of how these three elements are synchronized in a group of separately located transmitters follows.

According to the A/110 standard, control of two specific transmitter frequencies is required. First the RF frequency of the transmitted signal, as measured by the frequency of its pilot, must be accurately controlled to maintain frequencies of the transmitters close enough to one another that the receiver is not over-burdened with apparent Doppler shift between the signals. The symbol clock frequency must be accurately controlled to allow the output symbol stream to maintain stable, relative, time offsets between transmitters in a network. A flag, stream_locked_flag, in the DTxP packet structure is used to identify one of two options for performing symbol frequency synchronization. This flag is a 1-bit field that indicates to a slave transmitter whether it is to lock its symbol clock frequency to the incoming transport stream clock frequency (normal ATSC methodology) or to lock its symbol clock frequency to the same external precision reference frequency used throughout the network (e.g., GPS).

Data frame synchronization requires all of the slave modulators 212 in an SFN to use the same transport stream (TS) packet to start a VSB data frame (FIG. 4). In the current ATSC A/110 standard, this is accomplished by using DTxA 202 by inserting a cadence signal. In particular, a cadence signal (CS) is inserted at a deterministic point in time, once every 624 packets, into the MPEG-2 transport stream from the DTxA to each of the modulators 212. Dividing the rate of CS by half produces a Data Field Sync (DFS). The A/53 standard specifies that the data randomizer 102, RS encoder 104, and data interleaver 106 and intra-segment interleaver in part of 108 in the slave synchronized data processing blocks 210 shall all slave to DFS.

In addition, the A/110 standard provides that it is necessary to develop a state condition for the Trellis coder memories to be applied at a specific epoch in the data stream simultaneously by all RF transmission systems 208 in a network. According to the A/110 standard, "in order to put the precoders and trellis encoders of all the transmitters in a network in the same state at the same time, it is necessary to 'jam sync' them to the trellis coder model in the Distributed Transmission Adapter." In other words, Trellis coders cannot be synchronized by identifying an epoch in the transport stream (TS). Instead, to place the Trellis coders of all the transmitters in a network in the same states at the same time, at a deterministic point in time, a sample of all Trellis coder states in the data processing model 204 is captured, and this data is carried in an element of the DTxP, Trellis_code_state (FIG. 3), from DTxA 202 to all the slave modulators 212.

At a later, deterministic point in time, the Trellis code states that have been extracted from the DXP are used to initialize the memory of each Trellis coder in the slave modulators 212, to the state of the data processing model 204 in DTxA 202. Once this has been performed, the modulator Trellis coders are synchronized and all the modulators 212 should produce "coherent symbols." In addition, the DTxA indicates operating mode to the transmitters and provides information to be transmitted in the data field sync data segment through a field rate side channel, which carries information updated regularly at a data field rate.

The method used by A/110 standard to achieve Trellis coder synchronization adds much complexity to the overall SFN distributed transmission system design by requiring the DTxA 202 to sample the data processing model's Trellis coder states. Moreover, the A/110 does not provide the ability to post process data in the modulator once it exits the DTxA. A change of one bit in data stream after DTxA will break the Trellis code synchronization scheme thus making it difficult, if not impossible, to add enhancements to ATSC standard A/53. Moreover, as more transmitters are added in a multi-tier (e.g., distributed-translator) scheme the complexity of an SFN under the A/110 standard grows since an additional data processing model 204 must be added for each tier. Thus, what is needed is a technology that is scalable in SFN applications without adding additional complexity or constraints on system extensibility of the overall system.

Given the foregoing, what is needed is a system, method and computer program product for apparatus, systems and methods for producing coherent symbols in a single frequency network.

BRIEF DESCRIPTION OF THE INVENTION

The present invention meets the above-identified needs by providing apparatus, systems, and methods for producing coherent symbols in a single frequency network.

An advantage of the present invention is that it is backward compatible with existing ATSC standards and legacy ATSC receivers.

Another advantage of the present invention is that it provides a deterministic Trellis reset.

Yet another advantage of the present invention is that it provides deterministic VSB frame synchronization and can do so simultaneously with the deterministic Trellis reset in an efficient manner.

In one aspect of the present invention, systems, methods, apparatus and computer code are provided for producing a plurality of coherent symbols from a plurality of digital RF transmitters having a plurality of Trellis coders. A receiver receives digital signal containing content data to be broadcast from the digital RF transmitters. An packet inserter inserts a first initialization packet into the digital signal, where the initialization packet contains stuff bytes for deterministically initializing the Trellis coders in the digital RF transmitters. A transmitter transmits the digital signal to the digital RF transmitters.

Further features and advantages of the present invention as well as the structure and operation of various embodiments of the present invention are described in detail below with reference to the accompanying drawings.

BRIEF DESCRIPTION OF THE DRAWINGS

The features and advantages of the present invention will become more apparent from the detailed description set forth below when taken in conjunction with the drawings in which like reference numbers indicate identical or functionally similar elements.

FIG. 3 shows the structure of distributed transmission packet in accordance with the A/110 standard.

FIG. 10 depicts the output of an ATSC 52 segment continuous convolutional byte interleaver with an interleaved VFIP in accordance with an embodiment of the present invention.

FIG. 11 shows the structure of a VFIP in accordance with an embodiment of the present invention.

DETAILED DESCRIPTION

The present invention is now described in more detail herein in terms of an exemplary system, method and apparatus for producing coherent symbols in a single frequency network. This is for convenience only and is not intended to limit the application of the present invention. In fact, after reading the following description, it will be apparent to one skilled in the relevant art(s) how to implement the following invention in alternative embodiments (e.g., multi-frequency networks).

Generally, the present invention performs the required ATSC synchronizations: 1. frequency synchronization of the pilot or carrier frequencies, 2. data frame synchronization, and 3. pre-coder/trellis coder synchronization.

Frequency synchronization of the pilot or carrier is achieved by locking the carrier frequency of an exciter in the RF transmitter system to a reference from a GPS timebase.

The start of a data frame is determined (i.e., synchronized) by identifying a point in the transport stream via a special timing packet. Generally, a transport stream (TS) having a specialized timing packet is generated at a broadcast installation. The TS rate is locked to a GPS clock (e.g., 10 Mhz), and the GPS temporal reference (e.g., one pulse per second 1PPS)) is used to construct the timing packet. The synchronization packets identify a cadence "epoch" point in the TS, which is used to slave all the data frames to be broadcasted from one or more RF transmission systems, and hence provide data frame synchronization (DFS).

The present invention further provides a deterministic initialization of the Trellis coder memories by creating packets with predetermined data patterns located at deterministic positions throughout a data frame. The predetermined data patterns are transmitted from the broadcast station to an exciter to cause its Trellis coder states to be initialized in a fixed predictable fashion. Data frame synchronization and Trellis coder synchronization can thus occur using a single initialization packet.

Figure 5:
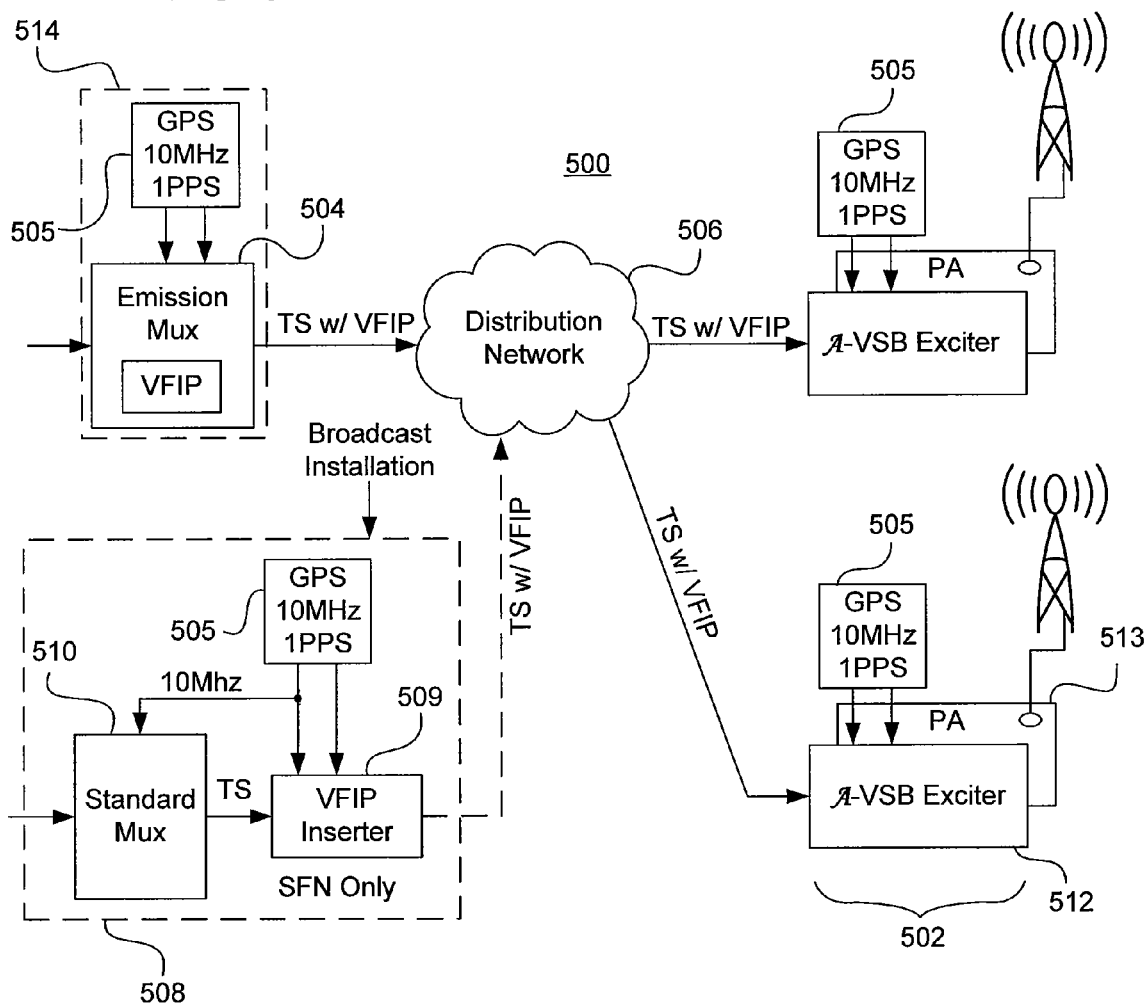
FIG. 5 is a system diagram of an exemplary SFN in accordance with an embodiment of the present invention.

FIG. 5 is a system diagram of an SFN 500 in accordance with an embodiment of the present invention. A transport stream emitter 514 in a broadcast installation such as a studio or network operations center ("NOC") is fed a data stream (e.g. MPEG-2 data stream). Transport stream emitter 514 transmits the data stream to a distribution network 506 in the form of a transport stream (TS) having VSB frame initialization packets (VFIPs). VFIPs are specialized synchronization packets generated by an emission multiplexer 504 of the transport stream emitter 514. In one embodiment, a VFIP module within an emission multiplexer 504 generates VFIPs. The TS with a VFIP is transmitted to one or more transmission systems 502 through a distribution network 506 (e.g., fiber, satellite, microwave and the like). Emission multiplexer 504 is clocked by a GPS timebase 505.

Another transport stream emitter configuration may be used instead of transport stream emitter 514. Transport stream emitter 508, for example, provides broadcast installations with the ability to use a standard multiplexer 510 with a VFIP inserter unit 509. In this alternative transport stream emitter configuration, transport stream emitter 508 includes an external VFIP inserter unit 509 communicatively coupled to a standard multiplexer 510. A transport stream (TS) with VFIP packets is similarly communicated from transport stream emitter 508 to RF transmission systems 502 through distribution network 506.

RF transmission systems 502 down stream from the broadcast Installation include an exciter 512 which can detect the VFIPs in the transport stream. In addition, RF transmission systems 502 include other components such as power amplifiers (PAs) 513. As noted above exciters are also sometimes referred to as modulators.

In one embodiment of the present invention, emission multiplexer 504 as well as all the other nodes in SFN 500 are clocked by a common timebase, GPS timebase 505. Frequency synchronization of the pilot or carrier is thus achieved by locking the carrier frequency of exciter 512 to the 10 MHz reference from the GPS timebase 505 to regulate the apparent Doppler shift seen by ATSC receiver from the SFN in overlapping coverage areas.

The following description of data frame synchronization and Trellis coder synchronization is applicable to both transport stream emitter configurations (514 and 508). For convenience, the following description is in terms of emission multiplexer 504. In the foregoing discussion when appropriate corresponding components of transport stream emitter 508 are identified.

As explained above, data frame synchronization requires that all exciters in an SFN choose the same packet from the incoming TS to begin a VSB data frame. In the present invention, each exciter 512 follows the frame synchronization timing of emission multiplexer 504 to achieve initial frame synchronization and to maintain this condition.

Emission multiplexer 504, has its data rate locked to the GPS reference 505, and initiates frame synchronization by selecting one of the TS packets to begin a VSB Frame. Once an initial TS packet has been selected to start the count, emission multiplexer 504 counts 623 TS packets inclusive of the selected packet (e.g., 0-622) emission multiplexer 504 inserts a VFIP as the last (623) packet. This corresponds to a container of data (624 packets) which is equivalent to the payload in an ATSC A/53 VSB frame having 624 payload segments.

Figure 6:
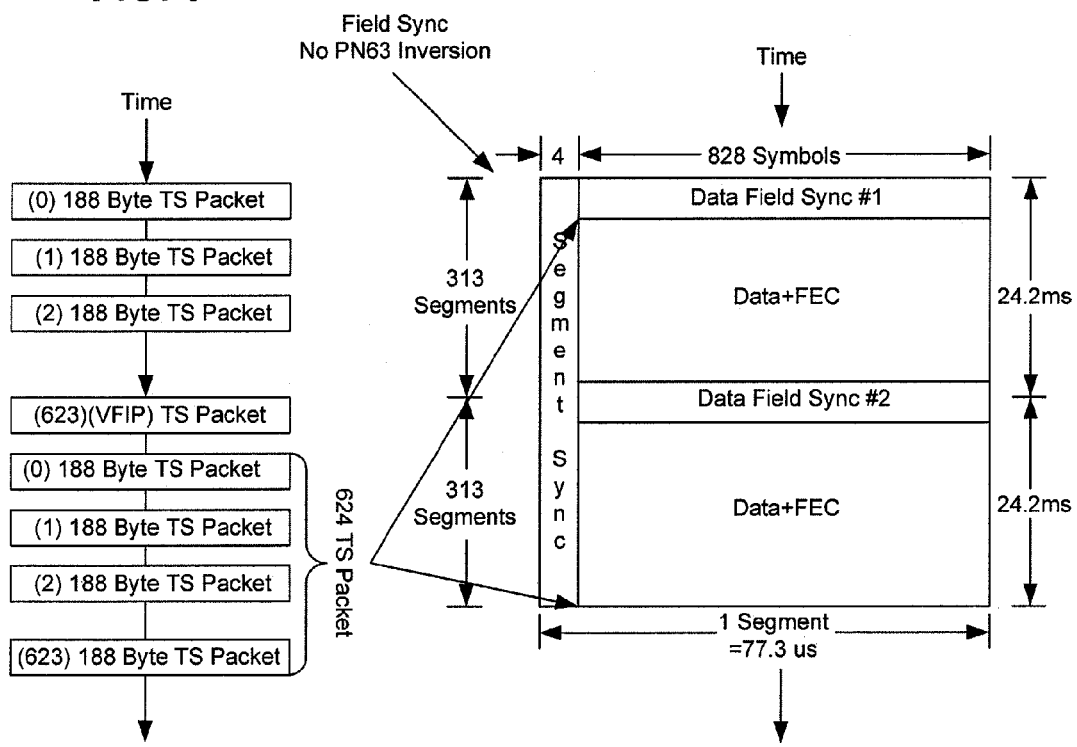
FIG. 6 illustrates a method for inserting VSB frame initialization packets (VFIPs) in accordance with an embodiment of the present invention.

Emission multiplexer 504 inserts a VSB frame initialization packet (VFIP), as shown in FIG. 6. By the placement of VFIP in the last packet slot (623) signaling of VSB frame is made implicit. Upon reception of the VFIP, each exciter 512 is signaled to the start a new data frame after the last bit of VFIP packet is received. The cadence also referred to as timing or frame rate of the VSB frames is thus based on the frame synchronization timing which is maintained by emission multiplexer 504. Since emission multiplexer 504 is locked to GPS timebase 505, the 0-623 packet count becomes the cadence of the VSB frame rate. After the first VFIP insertion, additional VFIPs can be inserted subsequently thereafter at a predetermined periodicity (e.g., approximately once per second). For example, whenever emission multiplexer 504 inserts a VFIP, it will appear in the 623 slot as determined by a cadence counter in emission multiplexer. As described in more detail below, additional timing parameters can be adjusted based on values of particular fields in the VFIP.

Figure 7:
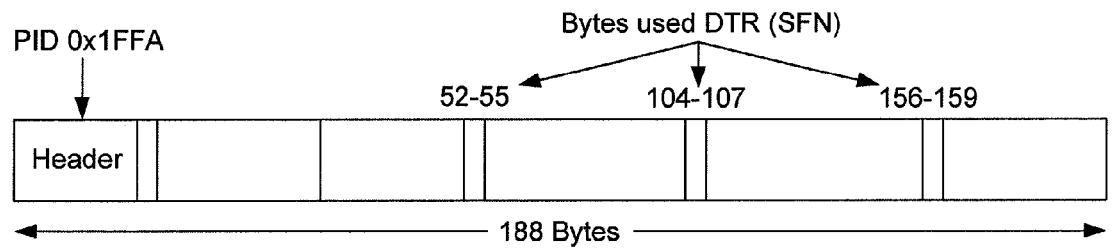
FIG. 7 depicts a structure of a VSB frame initialization packet (VFIP) in accordance with an embodiment of the present invention.

FIG. 7 depicts the structure of a VFIP in accordance with one embodiment of the present invention. As shown in FIG. 7, VFIP includes a packet identifier (PID) field stored in the header portion of the VFIP packet. Exciter 512 identifies a VFIP packet by its PID. In an exemplary embodiment, exciter 512 identifies a packet as a VFIP packet when its PID value is 0x1FFA. After the VFIP packet has been read, exciter 512 inserts a VSB data field sync (DFS). The frame payload segments thus begins after Data Field Sync #1. Exciter 512 in turn makes a determination whether 312 TS packets have been received. If so, exciter 512 inserts additional DFSs per the A/53 standard.

As described in the ATSC A/53 standard, a DFS includes a series of pseudorandom number (PN) sequences of length 511, 63, 63, and 63 symbols, respectively. The PN63 sequences are identical, except that the middle sequence is of opposite sign in every other field sync. This inversion allows the receiver to recognize the alternate data fields comprising a frame. In Data Field Sync #1 all three PN63 sequences are in the same phase and in Data Field Sync #2 the middle PN63 sequence is inverted and the other two have the same phase. The exciter 512 inserts a DFS with no PN63 inversion directly after the last bit of the VFIP packet and then continues with normal VSB frame construction starting with next TS packet (0) as first data-segment of the next VSB frame.

If an exciter 512 has already been frame synchronized, a received VFIP packet can be used to verify the exciter is still in phase with frame cadence maintained in emission multiplier because of the implicit placement of VFIP in transport stream.

As explained above, it is also necessary to develop a state condition for the Trellis coder memories to be applied at a specific epoch in the data stream simultaneously by all transmitters in a network. The present invention uses a deterministic Trellis reset (DTR) to perform Trellis coder synchronization by forcing the Trellis coder to go into a known zero state as a pre-determined byte in the VFIP packet enters the Trellis coder.

Figure 1:
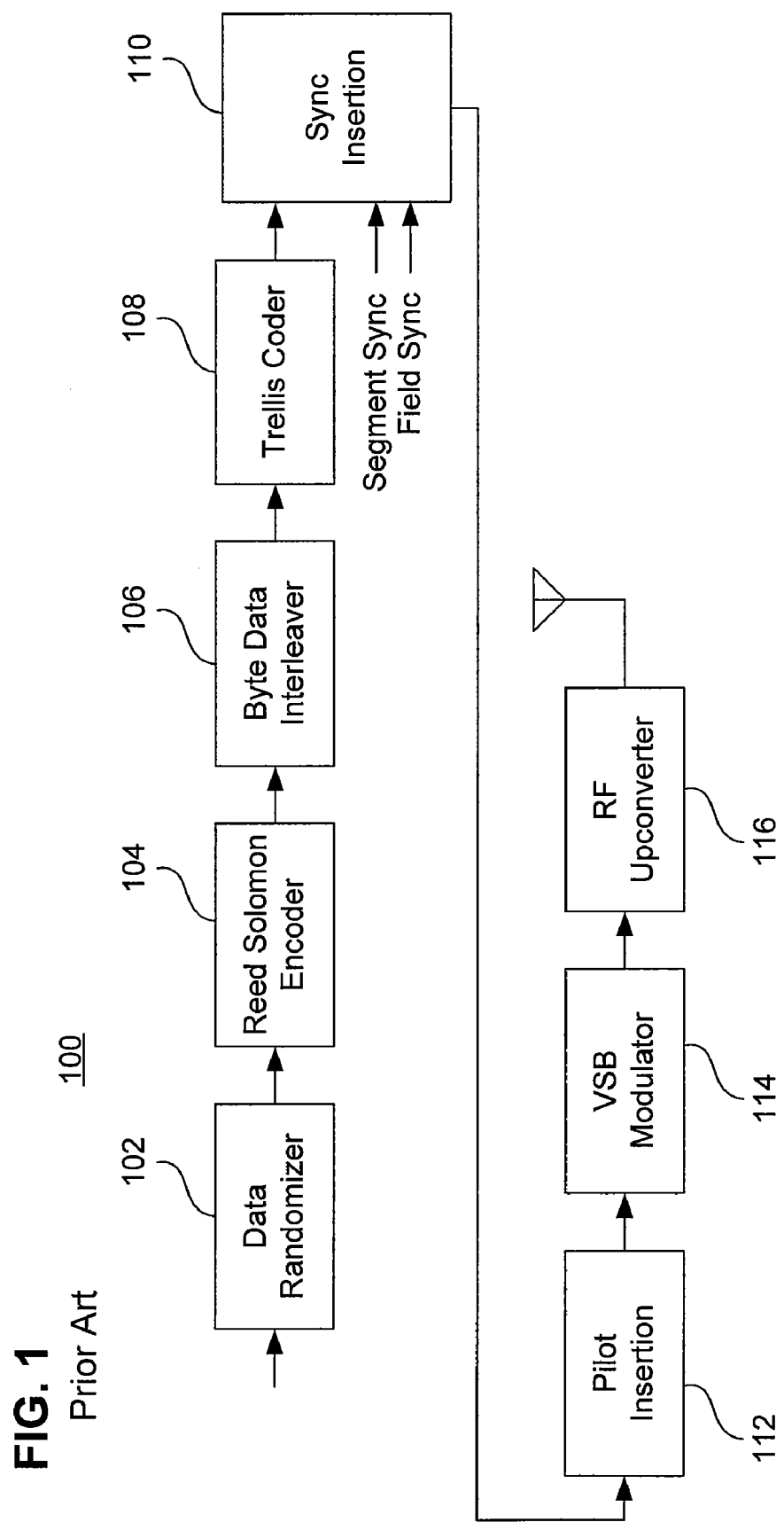
FIG. 1 is a block diagram of a Trellis-coded 8-VSB transmitter 100.
Figure 2:
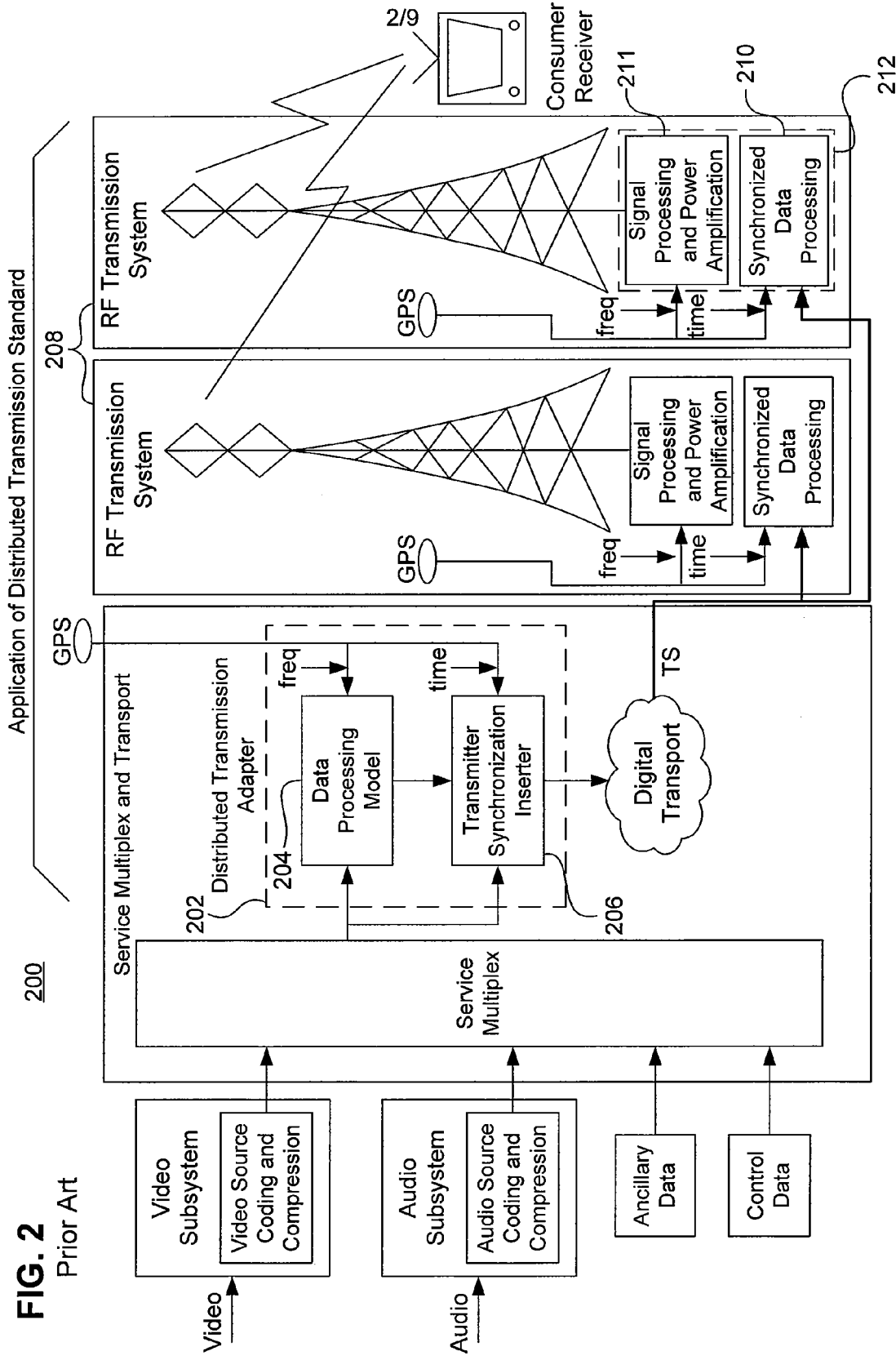
FIG. 2 shows a block diagram of an ATSC SFN system using A/110 distributed transmission where multiple Trellis coded 8T-VSB transmitters are fed by the same transport stream.
Figure 4:
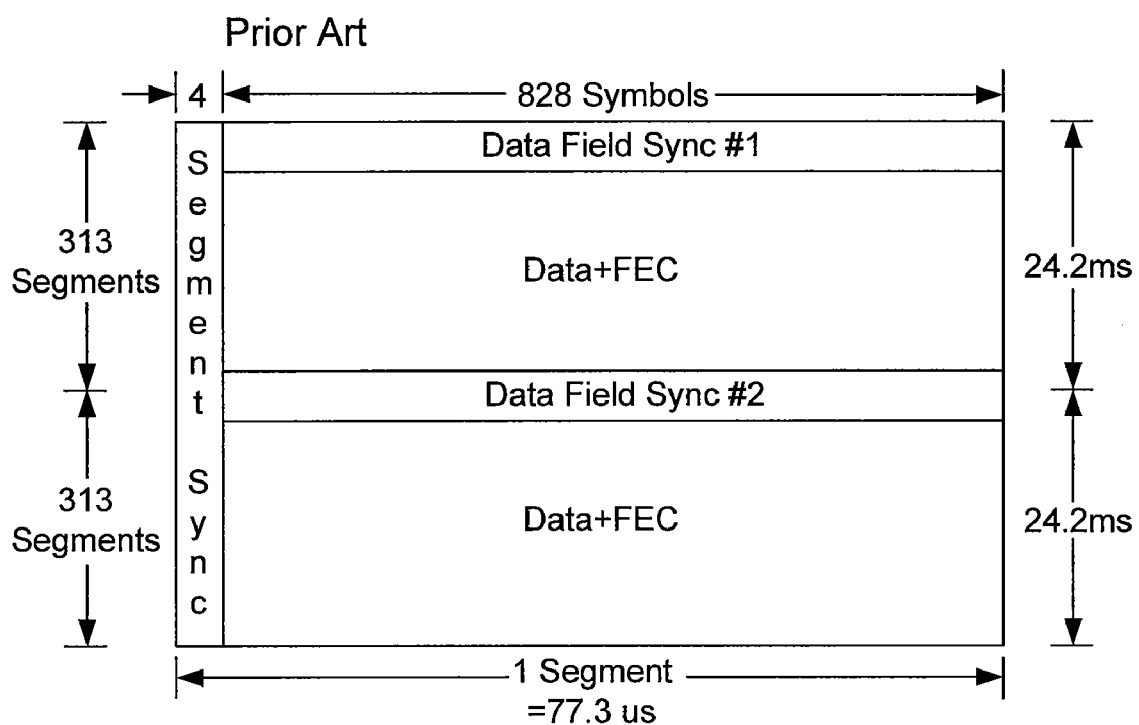
FIG. 4 depicts a VSB data frame in accordance with the ATSC A/53 standard.

Trellis coder synchronization is accomplished based on a priori knowledge of the location of the interleaved VFIP packet at the output of byte data interleaver 106 (FIG. 1) before the Trellis coder stage 108 (FIG. 1). With the knowledge of the output of the ATSC interleaver 106 once the data frame synchronization data has been achieved, twelve predetermined byte positions in VFIP are identified and used to trigger a DTR in each of the twelve Trellis coders in all of the exciters in the SFN. The initialization occurs as soon as each of these deterministically assigned bytes first enter its designated Trellis coder. More particularly, all Trellis coders are synchronized after the first four (4) segments of the VSB Data Frame without any need for any syntax in VFIP itself. Additional syntax, described in more detail below, can be added to control the emission timing and other auxiliary transmitter functions. Thus, by using emission multiplexer 504 (or standard multiplexer 510 and VFIP inserter 509) to insert a VFIP, VSB frame synchronization is implicitly signaled. By the time the fourth data segment of a new VSB frame is transmitted, all Trellis coders in all exciters will be deterministically reset to a common zero state. Coherent symbols will be produced by all transmitters in SFN.

Figure 8:
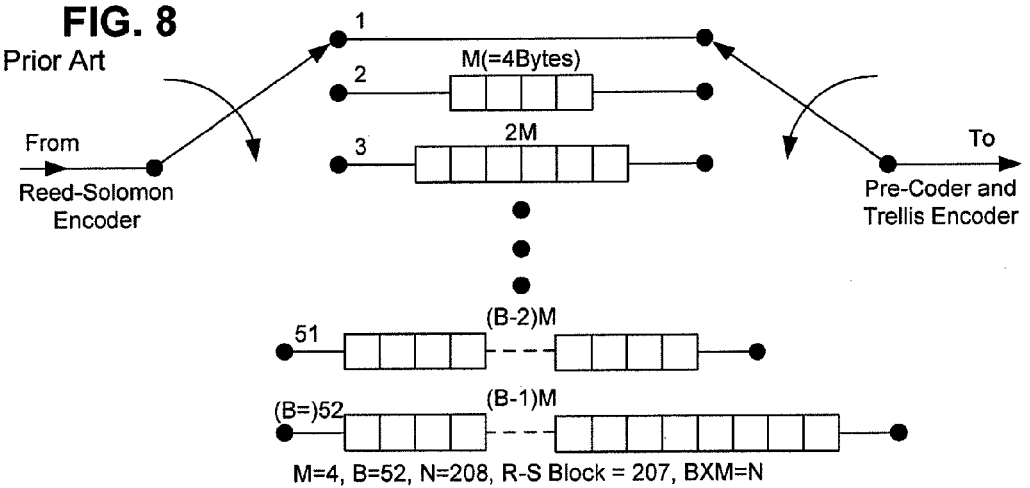
FIG. 8 is a block diagram of a data interleaver for interleaving a transport stream with VFIPs in accordance with an embodiment of the present invention.
Figure 9:
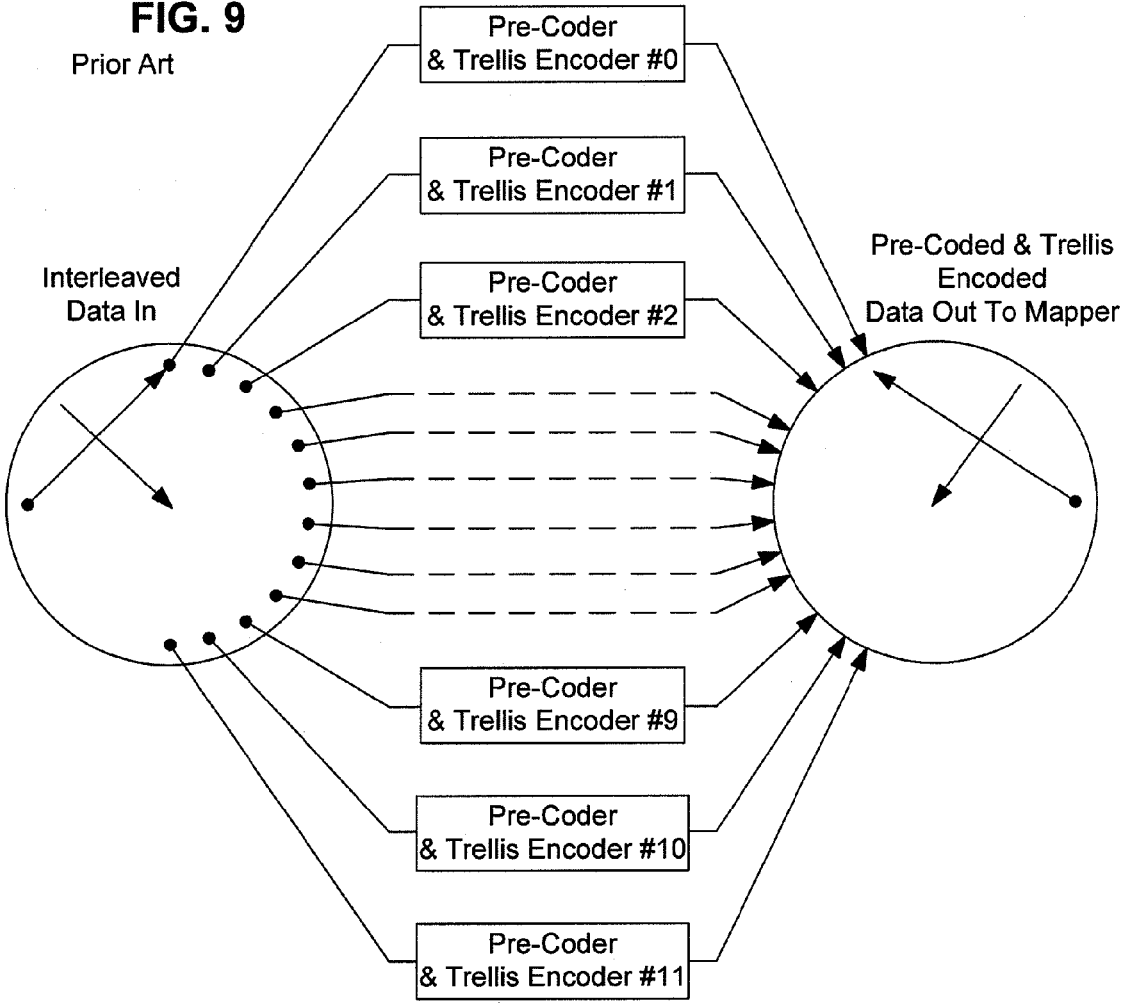
FIG. 9 is a block diagram of an interleaver commutator feeding interleaved VFIPs to Trellis coders in accordance with an embodiment of the invention.

FIG. 8 is a more detailed block diagram of an ATSC 52 segment continuous convolutional data interleaver. As shown, the interleaver is illustrated as shift registers which permute the symbols in the input signal, where the shift registers (except for the first one) cause a delay. FIG. 9 depicts how the interleaved data is fed to the Trellis coders (#0 through #11). The A/53 defines a deterministic starting point at the beginning of the first data segment of each data field. Based on this starting point and the beforehand knowledge of how byte data interleaver 106 will process a data stream, stuff bytes in a VFIP are pre-calculated and inserted in the correct byte positions to feed a respective one of the twelve Trellis coders. As each designated stuff byte enters a target Trellis coder, the DTR will be triggered.

FIG. 10 shows a memory map of the ATSC 52 segment continuous convolution data interleaver. As illustrated in FIG. 8, bytes are clocked in as illustrated by the commutator on left (i.e., from the Reed-Solomon encoder 104 output), and bytes are clocked out as illustrated by the commutator on the right from left to right (i.e., from the byte data interleaver 106 memory) and sent to the following stages of twelve (12) Trellis coders. As explained above, a Data Field Sync (DFS) is inserted later by the sync insertion unit 110 in the process by exciter 512. The DFS temporal position is shown in the mapping as a horizontal line across middle of diagram depicted in the mapping shown in FIG. 10 to aide in the understanding of the present invention. In particular, FIG. 10 shows the insertion of a DFS (with no PN63 inversion) in response to a VFIP in the last packet slot (i.e., the $623^{rd}$ packet) of the previous data frame.

The diagonal arrows in FIG. 10 show the positions assumed by bytes of the VFIP in the interleaver. As shown, a temporal dispersion of packets across VSB frame boundaries exists. Three of the VFIP bytes (51,103,153) reside in the last 52 segment group before the end of the previous frame (Frame n). The remaining data (bytes) are in the first 52 segments of current (Frame n+1). The (4) bytes marked on each of the three diagonal sections (i.e., the VFIP bytes 52-55, 104-107, 156-159 or "stuff bytes") will be delivered deterministically to each of the (12) Trellis coders numbered 5, 2, B, 8; 9, 6, 3, C; 1, A, 7, 4 (hex), respectively, when they exit the interleaver memory. This allows a deterministic trellis reset (DTR) to occur using each of the designated stuff bytes. Thus, a DTR occurs on processing of stuff bytes in a VFIP, and without affecting or occurring on packets carrying content (Video, Audio, Data). The VFIP Bytes 52-55, 104-107, 156-159 also are shown in FIG. 7 and in FIG. 11 ("Reserved stuff bytes DTR").

By knowing with certainty which VFIP bytes in an interleaved VFIP will pass through the Trellis coders, the stuff bytes can be used to trigger a Trellis reset (DTR) in all of the exciters in the SFN. More particularly, when each one of these (12) stuff bytes first enter its respective Trellis coders, it will cause the Trellis coder to initialize to a predetermined state. This will occur in a serial fashion over four (4) segments and effectively synchronizes all (12) Trellis coders in all exciters 512 in a deterministic fashion. Advantageously, the deterministic Trellis coder reset is thus implemented in exciter 512 such that it adheres to the normal Trellis coder trajectories of a four state Trellis coder. This permits well known switch combinational logic to be used to achieve a common state.

A parity error will occur on every VFIP by the action of the DTR on the twelve designated stuff bytes; this is accepted and will not affect packets carrying normal content. As described above, the twelve Trellis Encoders in each exciter 512 will be reset over the first four segments (0,1,2,3) of Frame N+1 using the stuff bytes. More particularly, each stuff byte used for DTR will cause a deterministic (1) byte error in the RS decoder when VFIP is received. The RS encoding in A/53 allows for correction of up to 10 byte errors per packet. The twelve stuff bytes when DTR is performed will exceed this correction range by two bytes and will generate packet error in RS Decoder. An ATSC receiver ignores a packet error on a VFIP because the VFIP is a reserved PID value defined for use an operational and maintenance packet (i.e., no content is carried within a VFIP). In particular, ATSC receivers demultiplex based on the PID value and ignore reserved packets (e.g., PID=0x1FFA) known not to be of any use to it. ATSC receivers also will ignore a packet if a parity byte error flag has been set in the header of that packet by the RS decoder in an ATSC receiver.

Referring to FIG. 11, another field in the VFIP is a 20 Byte RS parity field, VFIP_FEC, this additional outer RS coding provides byte errors correction (e.g., 10 byte error corrections) to protect the VFIP from possible errors introduced during transmission. This protects against errors on the distribution network link to the transmitters, and also permits special automated test and measurement equipment in the field to recover the payload of VFIP for network test and monitoring purposes. It should be understood that any type of correction coding that can provide the ability to detect and correct errors may be used instead of RS encoding and still be within the scope of the invention. In addition, the error-correction coding can be performed in the emission multiplexer 504 or by the VFIP inserter 509, depending on the transport stream emitter configuration used.

The remaining unused space in VFIP is used for syntax for the timing and control of the SFN. The VFIP period is controlled by a field in the VFIP called the periodic_value. Setting this flag to high causes the VFIP to be inserted on a periodic_value field periodic basis. In particular, a value in a periodic_value field indicates the number of frames between insertions of VFIP. For example, a value of 20 would indicate a VFIP packet will be inserted by emission multiplexer 504 every 20 data frames, i.e., approximately once per second. Instead of making the VFIP delay periodic, a VFIP can be inserted at any multiple of a data frame in step with cadence counter described above.

The distribution network 506 to the transmission system 502 inherently has a delay due to the type of distribution network, e.g., fiber, microwave, satellite and the like, and other connections, e.g., coax cables and the like. Timing syntax within the VFIP allows each RF transmitter 502 to calculate an overall delay to compensate for these delays and provide tight temporal control of the emission time of the coherent symbols from the antennas of all transmitters in a SFN and thus provides control over the delay spread seen by receiver.

Figure 12:
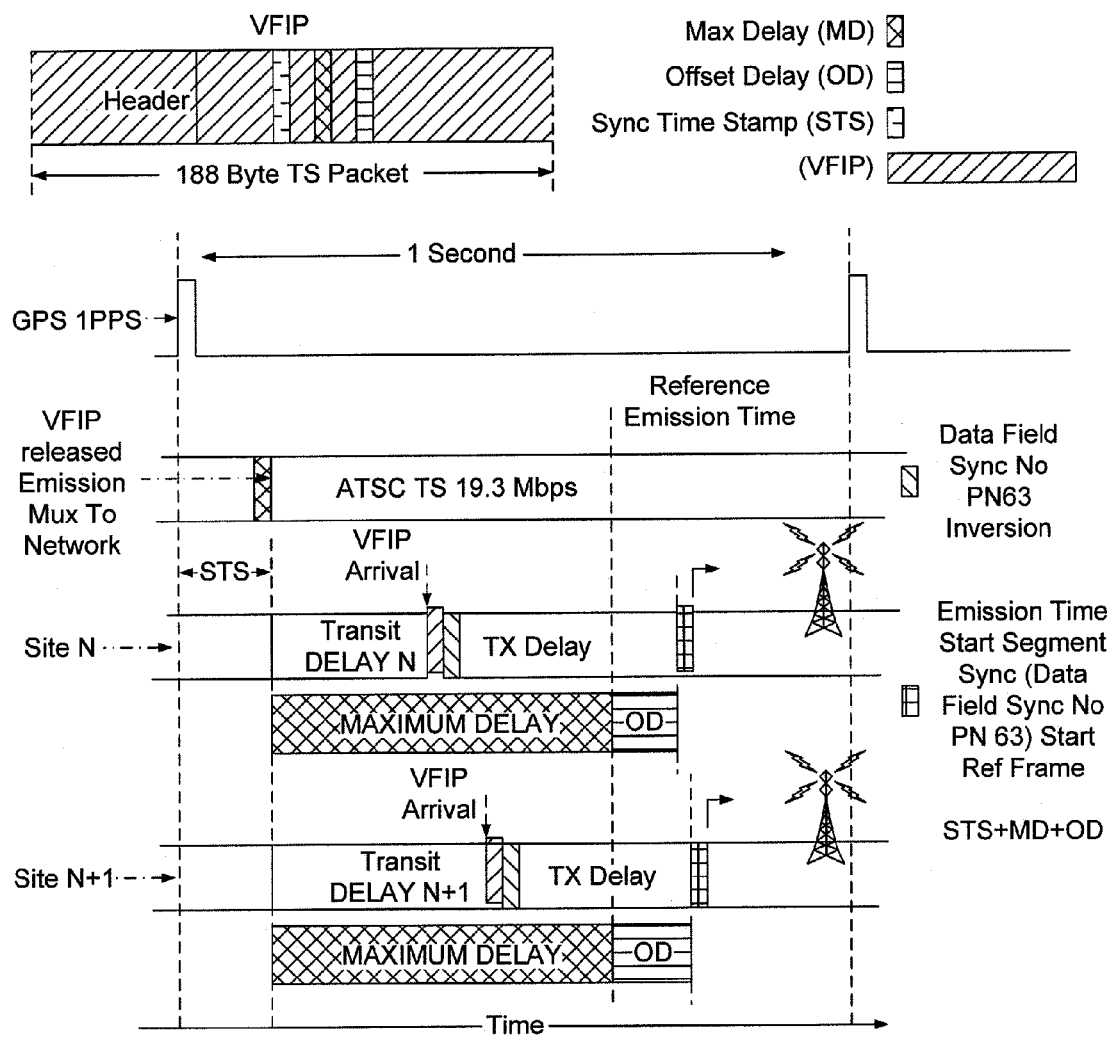
FIG. 12 depicts SFN synchronization timelines showing the timing syntax and semantics for an ATSC SFN in accordance with an embodiment of the present invention.

FIG. 12 depicts SFN synchronization timelines showing the timing syntax and semantics for an ATSC SFN in accordance with an embodiment of the present invention. Referring to FIGS. 11 and 12, sync_time_stamp (STS) and max_delay (MD or Maximum Delay) fields in the VFIP are used to provide compensation to all of the transmitters in the SFN for the unequal or time varying delay in distribution network 506. In addition, the tx_time_offset (OD) field is used to fine tune or adjust timing of a particular RF transmitter 502 in the SFN.

As described above, the transport stream emitter (514 and 508) and all the exciters 512 in the SFN (i.e., all nodes) use a GPS timebase 505 to receive a frequency 10 MHz and a temporal 1PPS reference. A 24 bit binary counter within the transport stream emitters keeps track of the reference clock based on the GPS timebase 505. This 24 bit counter is also available at all exciters 512. The 1PPS signal from the GPS timebase 505 is used to reset a 24 bit binary counter to zero on rising edge of 1PPS. The counter is clocked by a 10 MHz frequency reference and counts from 0-9999999 in one second, then resets to zero. Each clock tick and count advance is 100 nano seconds. This 24 bit binary counter technique is available in all nodes of the network and forms the basis for all time stamps used in the SFN.

The synch_time_stamp (STS) field in a VFIP is a 24 bit field containing the value the 24-bit counter will assume in emission multiplexer 504 observed at the instant VFIP leaves the emission multiplexer 504 to distribution network 506. In the alternative configuration, the synch_time stamp (STS) field in a VFIP is a 24 bit field containing the value the 24 bit binary counter will assume in the VFIP inserter 509 observed at the instant VFIP leaves the VFIP inserter 509 to distribution network 506. Similar 24-bit counters are included in the RF transmitter systems 502. All counters at all the nodes in the network are synchronized to the same GPS 10 MHz and 1PPS, allowing their counts to be synchronized. Each increment of the counter is 100 nano seconds. This known value is used in each RF transmitter 502 to calculate a transit delay (TD) through its respective distribution network (e.g., Satellite, Microwave, Fiber, and the like). More particularly, as described above, the STS value is the time that the VFIP left emission multiplexer 504 and entered distribution network 506. The STS value is compared to an observation of the current count of the 24 bit counter in exciter 512 the instant the VFIP is received to determine the TD of how long (i.e., how many 100 nano second increments) the VFIP packet took to arrive through the distribution network 506. FIG. 12 shows graphically the release of VFIP into distribution network 506 and the instant VFIP arrives at a transmitter 502 as a function of time.

The maximum_delay field in the VFIP (corresponding to Maximum Delay or MD in FIG. 12) is a 24-bit value containing a predetermined delay value established based on a quantitative review of the delays of all distribution paths to all digital RF transmitters in the SFN. Particularly, the maximum_delay value entered is calculated to be greater than the delay of the longest path in distribution network 506. By selecting an MD value larger than the maximum transit delay expected through all distribution paths, an input buffer can be calculated and setup in each exciter 512 to delay the incoming TS packets such that they are transmitted from all transmitters simultaneously regardless of the transit time of a packet through distribution network 506. This is shown in FIG. 12 as the Reference Emission Time. The reference emission time is the start of segment sync in DFS (without PN63 inversion) immediately following VFIP.

The tx_time_offset (OD) field is a 16 bit value addressed to each transmitter that contains an optional delay value used to fine tune the delay spread of particular transmitters to optimize the network.

Thus, based on the calculation of how long the VFIP packet took to arrive using in part the synch_time_stamp (STS), the maximum_delay (MD) value and a tx_offset_delay (OD), an RF transmitter 502 can set its input delay buffer, TX Delay. Accordingly, the value of the delay buffer in each exciter 512, TX Delay, is shown in FIG. 12 and defined by Equation (1) as follows:

$$TX\ Delay = STS + MD + OD - TD \tag{1}$$

Thus, the TX delay for each exciter in the SFN 500 is independently calculated. Each RF transmitter 502, in turn, uses the delay global values (e.g., STS, MD) to establish the reference emission time. The individually addressed OD allows fine control of the emission time of the coherent symbols from all the antennas of all transmitters in a SFN and hence will control the delay spread seen by ATSC receiver. A local value (e.g., 16 bit value, not shown) also can be entered at each site to compensate for the delay calculated through the transmitters, output filters and transmission line length feeding the Antenna. This value is subtracted from MD for a particular transmitter to obtain fine resolution on emission time from the antenna which is the reference or demarcation point in an SFN system (i.e., the point at which the RF signal guided wave transitions into free space).

While various embodiments of the present invention have been described above, it should be understood that they have been presented by way of example, and not limitation. It will be apparent to persons skilled in the relevant art(s) that various changes in form and detail can be made therein without departing from the spirit and scope of the present invention. Thus, the present invention should not be limited by any of the above described exemplary embodiments, but should be defined only in accordance with the following claims and their equivalents.

In addition, it should be understood that the figures illustrated in the attachments, which highlight the functionality and advantages of the present invention, are presented for example purposes only. The architecture of the present invention is sufficiently flexible and configurable, such that it may be utilized in ways other than that shown in the accompanying figures.

Further, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

What is claimed is:

1. A method for producing a plurality of coherent symbols from a plurality of digital RF transmitters having a plurality of Trellis coders, comprising the steps of:
   receiving a digital signal containing content data to be broadcast from the plurality of digital RF transmitters;
   inserting an initialization packet into the digital signal, the initialization packet containing a plurality of stuff bytes positioned in predetermined byte positions, respectively, setting each one of the plurality of Trellis coders to a predetermined state as a corresponding stuff byte enters; and
   transmitting the digital signal containing the initialization packet to the plurality of digital RF transmitters.

2. The method according to claim 1, further comprising the steps of:
   counting a predetermined number of packets from the initialization packet; and
   inserting another initialization packet into the digital signal after the predetermined number of packets.

3. The method of claim 1, wherein the digital signal is a transport stream.

4. The method of claim 1, further comprising the step of:
   error-correction coding the initialization packet.

5. The method of claim 1, further comprising the steps of:
   generating a synchronization timestamp based from a common timebase;
   storing the value of the synchronization timestamp into a synchronization time stamp field in the initialization packet;
   storing a predetermined maximum delay value into a maximum delay field in the initialization packet;
   generating an offset delay value respectively for each one of the plurality of RF transmitters;
   storing the offset delay value into a transmitter time offset field in the initialization packet; and
   storing a transmitter address corresponding to the offset delay into a transmitter address field in the initialization packet.

6. The method according to claim 5, wherein the common timebase is the global positional system (GPS).

7. The method according to claim 1, further comprising the step of:
   storing a mapping of an interleaver; and
   placing the plurality stuff bytes in the initialization packet in accordance with the mapping.

8. The method of claim 1, further comprising the step of:
   locking a symbol clock and a carrier frequency of a modulator of the plurality of digital RF transmitters to a common timebase.

9. The method of claim 8, further comprising the step of:
   locking the digital signal to the common timebase.

10. The method according to claim 9, wherein the common timebase is the global positional system (GPS).

11. The method of claim 1, wherein the digital RF transmitters include at least one of an eight-level vestigial sideband (8-VSB) modulator and an eight-level Trellis vestigial sideband (8T-VSB) modulator, and a power amplifier.

12. The method of claim 1, further comprising the step of:
   synchronizing a plurality of data frames based on the arrival of the initialization packet.

13. The method of claim 1, further comprising the step of:
   slaving a plurality of data frames to be broadcasted from the plurality of digital RF transmitters based on reception of the initialization packet.

14. The method of claim 1, further comprising the step of:
calculating a delay metric corresponding to a synchronization timestamp, a maximum delay value, and an offset delay value in the initialization packet, and a common timebase, wherein the synchronization timestamp is a value of the common timebase observed when the initialization packet is transmitted into a distribution network, wherein the maximum delay value corresponds to a delay in a distribution network, and the offset delay value corresponds to a delay value addressed to a respective one of the plurality of digital RF transmitters.

15. The method according to claim 14, wherein the common timebase is the global positional system (GPS).

16. The method of claim 1, further comprising the step of:
delaying the digital signal from being transmitted by the plurality of RF transmitters by a predetermined delay.

17. The method of claim 16, wherein the predetermined delay is greater than the longest delay path in a distribution network to the plurality of digital RF transmitters.

18. An apparatus for producing one or more initialization packets, comprising:
a receiver operable to receive a digital signal containing content data to be broadcast from a plurality of digital RF transmitters;
a packet inserter operable to insert an initialization packet into the digital signal, the initialization packet containing a plurality of stuff bytes positioned in predetermined byte positions, respectively, setting each one of the plurality of Trellis coders to a predetermined state as a corresponding stuff byte enters; and
a transmitter operable to transmit the digital signal to the plurality of digital RF transmitters.

19. The apparatus according to claim 18, further comprising:
a counter operable to count a predetermined number of packets from the initialization packet, and
wherein the packet inserter is further operable to insert another initialization packet into the digital signal after the predetermined number of packets.

20. The apparatus of claim 18, wherein the digital signal is a transport stream.

21. The apparatus of claim 18, further comprising:
an encoding unit operable to error-correction code the initialization packet.

22. The apparatus of claim 18, further comprising:
a common timebase operable to generate a synchronization timestamp, wherein the packet inserter is further operable to insert the value of the synchronization timestamp into a synchronization time stamp field in the initialization packet and store a predetermined maximum delay value into a maximum delay field in the initialization packet;
a delay unit operable to generate an offset delay value respectively for each one of the plurality of RF transmitters, wherein said inserter is further operable to store the offset delay value into a transmitter time offset field in the initialization packet and store a transmitter address corresponding to the offset delay into a transmitter address field in the initialization packet.

23. The apparatus according to claim 22, wherein the common timebase is the global positional system (GPS).

24. The apparatus according to claim 18, further comprising:
a memory for storing a mapping of an interleaver; and
a packet generator operable to place the stuff bytes in the initialization packet in accordance with the mapping.

25. The apparatus of claim 18, further comprising:
a timing unit operable to lock a symbol clock and a carrier frequency of a modulator of the plurality of digital RF transmitters to a common timebase.

26. The apparatus of claim 25, wherein the timing unit is further operable to lock the digital signal to the common timebase.

27. The apparatus according to claim 26, wherein the common timebase is the global positional system (GPS).

28. The apparatus of claim 18, wherein the digital RF transmitters include at least one of an eight-level vestigial sideband (8-VSB) modulator and an eight-level Trellis vestigial sideband (8T-VSB) modulator, and a power amplifier.

29. The apparatus of claim 18, further comprising:
a synchronizer operable to synchronize a plurality of data frames based on the arrival of the initialization packet.

30. The apparatus of claim 18, wherein a plurality of data frames are slaved to be broadcasted from the plurality of digital RF transmitters based on reception of the initialization packet.

31. The apparatus of claim 18, further comprising:
a delay unit operable to calculate a delay metric corresponding to a synchronization timestamp, a maximum delay value, and an offset delay value in the initialization packet, and a common timebase, wherein the synchronization timestamp is a value of the common timebase observed when the initialization packet is transmitted into a distribution network, wherein the maximum delay value corresponds to a delay in a distribution network, and the offset delay value corresponds to a delay value addressed to a respective one of the plurality of digital RF transmitters.

32. The apparatus according to claim 31, wherein the common timebase is the global positional system (GPS).

33. The apparatus of claim 18, further comprising:
a delay unit operable to delay the digital signal from being transmitted by the plurality of RF transmitters by a predetermined delay.

34. The apparatus of claim 33, wherein the predetermined delay is greater than the longest delay path in a distribution network to the plurality of digital RF transmitters.

35. A computer program product comprising a non-transitory computer readable medium having control logic stored therein for causing a computer to produce a plurality of coherent symbols from a plurality of digital RF transmitters having a plurality of Trellis coders, said control logic comprising:
computer readable program code means for causing the computer to receive a digital signal containing content data to be broadcast from the plurality of digital RF transmitters;
computer readable program code means for causing the computer to insert an initialization packet into the digital signal, the initialization packet containing a plurality of stuff bytes positioned in predetermined byte positions, respectively, for setting each one of the plurality of Trellis coders to a predetermined state as a corresponding stuff byte enters; and
computer readable program code means for causing the computer to transmit the digital signal to the plurality of digital RF transmitters.

36. The computer program product of claim 35, further comprising:
computer readable program code means for causing the computer to count a predetermined number of packets from the initialization packet; and computer readable program code means for causing the computer to inserting another initialization packet into the digital signal after the predetermined number of packets.

37. The computer program product of claim 35, wherein the digital signal is a transport stream.

38. The computer program product of claim 35, further comprising:
computer readable program code means for causing the computer to error-correction code the initialization packet.

39. The computer program product of claim 35, further comprising:
computer readable program code means for causing the computer to generate a synchronization timestamp based from a common timebase;
computer readable program code means for causing the computer to store the value of the synchronization timestamp into a synchronization time stamp field in the initialization packet;
computer readable program code means for causing the computer to store a predetermined maximum delay value into a maximum delay field in the initialization packet;
computer readable program code means for causing the computer to generate an offset delay value respectively for each one of the plurality of RF transmitters;
computer readable program code means for causing the computer to store the offset delay value into a transmitter time offset field in the initialization packet; and
computer readable program code means for causing the computer to store a transmitter address corresponding to the offset delay into a transmitter address field in the initialization packet.

40. The computer program product of claim 39, wherein the common timebase is the global positional system (GPS).

41. The computer program product of claim 35, further comprising:
computer readable program code means for causing the computer to store a mapping of an interleaver; and
computer readable program code means for causing the computer to place the plurality stuff bytes in the initialization packet in accordance with the mapping.

42. The computer program product of claim 35, further comprising:
computer readable program code means for causing the computer to lock a symbol clock and a carrier frequency of a modulator of the plurality of digital RF transmitters to a common timebase.

43. The computer program product of claim 42, further comprising:
computer readable program code means for causing the computer to lock the digital signal to the common timebase.

44. The computer program product of claim 43, wherein the common timebase is the global positional system (GPS).

45. The computer program product of claim 35, wherein the digital RF transmitters include at least one of an eight-level vestigial sideband (8-VSB) modulator and an eight-level Trellis vestigial sideband (8T-VSB) modulator, and a power amplifier.

46. The computer program product of claim 35, further comprising:
computer readable program code means for causing the computer to synchronize a plurality of data frames based on the arrival of the initialization packet.

47. The computer program product of claim 35, further comprising:
computer readable program code means for causing the computer to slave a plurality of data frames to be broadcasted from the plurality of digital RF transmitters based on reception of the initialization packet.

48. The computer program product of claim 35, further comprising:
computer readable program code means for causing the computer to calculate a delay metric corresponding to a synchronization timestamp, a maximum delay value, and an offset delay value in the initialization packet, and a common timebase, wherein the synchronization timestamp is a value of the common timebase observed when the initialization packet is transmitted into a distribution network, wherein the maximum delay value corresponds to a delay in a distribution network, and the offset delay value corresponds to a delay value addressed to a respective one of the plurality of digital RF transmitters.

49. The computer program product of claim 48, wherein the common timebase is the global positional system (GPS).

50. The computer program product of claim 35, further comprising:
computer readable program code means for causing the computer to delay the digital signal from being transmitted by the plurality of RF transmitters by a predetermined delay.

51. The computer program product of claim 50, wherein the predetermined delay is greater than the longest delay path in a distribution network to the plurality of digital RF transmitters.

52. A system for producing coherent symbols from a plurality of RF transmitters having a plurality of Trellis coders, comprising:
a distribution network;
a multiplexer operable to receive a digital signal and insert an initialization packet into the digital signal and to transmit the digital signal over a distribution network; and
a plurality of modulators operable to receive the digital signal from the distribution network and modulate the digital signal, and
wherein the initialization packet contains a plurality of stuff bytes positioned in predetermined byte positions, respectively, setting each one of a plurality of Trellis coders in the plurality of modulators to a predetermined state as a corresponding stuff byte enters.

53. The system according to claim 52, wherein the multiplexer is further operable to count a predetermined number of packets from the initialization packet, and insert another initialization packet into the digital signal after the predetermined number of packets.

54. The system of claim 52, wherein the digital signal is a transport stream.

55. The system of claim 52, wherein the multiplexer is further operable to error-correction code the initialization packet.

56. The system of claim 52, further comprising:
a common timebase operable to generate a synchronization timestamp, wherein the multiplexer is further operable to insert the value of the synchronization timestamp into a synchronization time stamp field in the initialization packet and store a predetermined maximum delay value into a maximum delay field in the initialization packet, and
wherein the multiplexer is further operable to generate an offset delay value respectively for each one of the plurality of RF transmitters, wherein the multiplexer is further operable to store the offset delay value into a transmitter time offset field in the initialization packet and store a transmitter address corresponding to the offset delay into a transmitter address field in the initialization packet.

57. The system according to claim 56, wherein the common timebase is the global positional system (GPS).

58. The system according to claim 57, wherein the multiplexer is further operable to store a mapping of an interleaver and place the plurality stuff bytes in the initialization packet in accordance with the mapping.

59. The system of claim 52, wherein the modulator is further operable to lock a symbol clock and a carrier frequency of the modulator to a common timebase.

60. The system of claim 59, wherein the multiplexer and the modulator are operable to lock the digital signal to the common timebase.

61. The system according to claim 60, wherein the common timebase is the global positional system (GPS).

62. The system of claim 52, wherein the modulator is at least one of an eight-level vestigial sideband (8-VSB) modulator and an eight-level Trellis vestigial sideband (8T-VSB) modulator.

63. The system of claim 52, wherein the modulator is further operable to synchronize a plurality of data frames based on the arrival of the initialization packet.

64. The system of claim 52, wherein a plurality of data frames are slaved to be broadcasted from the plurality of digital RF transmitters based on reception of the initialization packet.

65. The system of claim 52, wherein the modulator is further operable to calculate a delay metric corresponding to a synchronization timestamp, a maximum delay value, and an offset delay value in the initialization packet, and a common timebase, wherein the synchronization timestamp is a value of the common timebase observed when the initialization packet is transmitted into a distribution network, wherein the maximum delay value corresponds to a delay in a distribution network, and the offset delay value corresponds to a delay value addressed to a respective one of the plurality of digital RF transmitters.

66. The system according to claim 65, wherein the common timebase is the global positional system (GPS).

67. The system of claim 52, wherein the modulator is further operable to delay the digital signal from being transmitted by the plurality of RF transmitters by a predetermined delay.

68. The system of claim 67, wherein the predetermined delay is greater than the longest delay path in a distribution network to the plurality of digital RF transmitters.

69. An apparatus for producing a plurality of coherent symbols from a plurality of digital RF transmitters having a plurality of Trellis coders, comprising:
means for receiving a digital signal containing content data to be broadcast from the plurality of digital RF transmitters;
means for inserting an initialization packet into the digital signal, the initialization packet containing a plurality of stuff bytes positioned in predetermined byte positions, respectively, setting each one of the plurality of Trellis coders to a predetermined state as a corresponding stuff byte enters; and
means for transmitting the digital signal to the plurality of digital RF transmitters.

70. The apparatus according to claim 69, further comprising:
means for counting a predetermined number of packets from the initialization packet; and
means for inserting another initialization packet into the digital signal after the predetermined number of packets.

71. The apparatus of claim 69, wherein the digital signal is a transport stream.

72. The apparatus of claim 69, further comprising:
means for error-correction coding the initialization packet.

73. The apparatus of claim 69, further comprising:
means for generating a synchronization timestamp based from a common timebase;
means for storing the value of the synchronization timestamp into a synchronization time stamp field in the initialization packet;
means for storing a predetermined maximum delay value into a maximum delay field in the initialization packet;
means for generating an offset delay value respectively for each one of the plurality of RF transmitters;
means for storing the offset delay value into a transmitter time offset field in the initialization packet; and
means for storing a transmitter address corresponding to the offset delay into a transmitter address field in the initialization packet.

74. The apparatus according to claim 69, further comprising:
means for storing a mapping of an interleaver; and
means for placing the plurality stuff bytes in the initialization packet in accordance with the mapping.

75. The apparatus of claim 69, further comprising:
means for locking a symbol clock and a carrier frequency of a modulator of the plurality of digital RF transmitters to a common timebase.

76. The apparatus of claim 75, further comprising:
means for locking the digital signal to the common timebase.

77. The apparatus of claim 69, further comprising:
means for synchronizing a plurality of data frames based on the arrival of the initialization packet.

78. The apparatus of claim 69, further comprising:
means for slaving a plurality of data frames to be broadcasted from the plurality of digital RF transmitters based on reception of the initialization packet.

79. The apparatus of claim 69, further comprising the step of:
means for calculating a delay metric corresponding to a synchronization timestamp, a maximum delay value, and an offset delay value in the initialization packet, and a common timebase, wherein the synchronization timestamp is a value of the common timebase observed when the initialization packet is transmitted into a distribution network, wherein the maximum delay value corresponds to a delay in a distribution network, and the offset delay value corresponds to a delay value addressed to a respective one of the plurality of digital RF transmitters.

80. The apparatus of claim 69, further comprising:
means for delaying the digital signal from being transmitted by the plurality of RF transmitters by a predetermined delay.

* * * * *

UNITED STATES PATENT AND TRADEMARK OFFICE
CERTIFICATE OF CORRECTION

| | | |
|---|---|---|
| PATENT NO. | : 7,738,582 B2 | Page 1 of 2 |
| APPLICATION NO. | : 11/276434 | |
| DATED | : June 15, 2010 | |
| INVENTOR(S) | : Michael Simon | |

It is certified that error appears in the above-identified patent and that said Letters Patent is hereby corrected as shown below:

Title Page, Item [56] REFERENCES CITED

"2004062283 A1" should read --2004/062283 A1--.

[57] ABSTRACT

Line 6, "packets" should read --packet's--.
Line 7, "Where" should be deleted.
Line 8, "the" should read --The--.

COLUMN 2

Line 2, "Trellis Coded" should read --Trellis-coded--.
Line 37, "is" should read --are--.

COLUMN 3

Line 61, "trellis" should read --Trellis--.
Line 63, "trellis" should read --Trellis--.

COLUMN 5

Line 59, "pre-coder/trellis" should read --pre-coder/Trellis--.

COLUMN 6

Line 42, "down stream" should read --downstream--.
Line 43, "Installation" should read --installation--.

Signed and Sealed this
Twelfth Day of April, 2011

David J. Kappos
*Director of the United States Patent and Trademark Office*

CERTIFICATE OF CORRECTION (continued)
U.S. Pat. No. 7,738,582 B2

COLUMN 7

Line 18, "the" (first occurrence) should be deleted.

COLUMN 8

Line 51, "aide" should read --aid--.
Line 67, "trellis" should read --Trellis--.

COLUMN 9

Line 11, "enter" should read --enters--.
Line 32, "use" should read --use in--.
Line 40, "Byte" should read --byte--.

COLUMN 10

Line 31, "nano seconds." should read --nanoseconds.--.
Line 46, "nano seconds." should read --nanoseconds.--.
Line 55, "nano second" should read --nanosecond--.

COLUMN 11

Line 2, "setup" should read --set up--.
Line 34, "Antenna." should read --antenna.--.

COLUMN 12
Line 43, "step" should read --steps--.

COLUMN 13

Line 52, "packet;" should read --packet; and--.

COLUMN 15

Line 2, "inserting" should read --insert--.
Line 42, "plurality" should read --plurality of--.

COLUMN 17

Line 11, "plurality" should read --plurality of--.

COLUMN 18

Line 31, "plurality" should read --plurality of--.